United States Patent [19]

Brown et al.

[11] Patent Number: 5,332,973
[45] Date of Patent: Jul. 26, 1994

[54] BUILT-IN FAULT TESTING OF INTEGRATED CIRCUITS

[75] Inventors: Bradley D. Brown, Oakbank; Robert D. McLeod; Douglas J. Thomson, both of Winnipeg, all of Canada

[73] Assignee: The University of Manitoba, Winnipeg, Canada

[21] Appl. No.: 876,790

[22] Filed: May 1, 1992

[51] Int. Cl.⁵ .......................................... G01R 31/00
[52] U.S. Cl. ................................. 324/537; 324/500; 361/93; 371/5.1; 371/25.1
[58] Field of Search ............... 324/500, 537, 158 T; 371/5.1, 21.4, 25.1; 361/57, 65, 88, 93; 307/131

[56] References Cited

U.S. PATENT DOCUMENTS

| | | | |
|---|---|---|---|
| 4,961,053 | 10/1990 | Krug | 371/25.1 X |
| 5,023,684 | 6/1991 | Tsunoda | 361/93 X |
| 5,025,344 | 6/1991 | Maly et al. | 361/88 |
| 5,103,166 | 4/1992 | Jeon et al. | 324/537 X |
| 5,111,136 | 5/1992 | Kawashima | 324/158 T |

OTHER PUBLICATIONS

Agarwal et al., Techniques for Implemention Large Area Devices-Elect Comp Eng-pp. 220, 221 & 224, Jan., 1986.
Carley et al., A Circuit Breaker For Redundant IC Systems-1988 Custom Integrated Circuits Conference pp. 27.6.1 & 27.6.5, Jan., 1988.
Feltham et al., Current Sensing for Built-In Testing of CMOS Circuits-Elect Comp Eng pp. 454 and 455, May 1988.

*Primary Examiner*—Walter E. Snow
*Assistant Examiner*—Glenn W. Brown
*Attorney, Agent, or Firm*—Adrian D. Battison; Stanley G. Ade; Murray E. Thrift

[57] ABSTRACT

Built-in current mode quiescent current monitoring circuitry is provided for measuring a circuit's or a sub-circuit's quiescent current. Anomalously high quiescent current (Iddq) generally results as a consequence of a manufacturing defect. These defects include those not detected by tests generated using traditional fault models. The technique provided here is based upon generating a proportionally matched current to the circuit under test current by a control loop. The proportionally matched current is then sent to a comparator where it is compared to a reference current, the reference current representing an acceptable quiescent current level. The output of the comparator then indicates whether the quiescent current is above or below the reference current.

15 Claims, 6 Drawing Sheets

BUILT-IN FAULT TESTING OF INTEGRATED CIRCUITS

BACKGROUND OF THE INVENTION

This invention relates to a semiconductor integrated circuit and particularly to a fault detection circuit provided on the same substrate as the main circuit for detecting faults in the main circuit.

For many years industry has employed off chip current monitoring as a means of detecting faults in integrated circuits. This technique is usually employed in conjunction with other traditional test methods such as generating stimulae and observing the output of the circuit and the test. Not only must the fault in question be controlled but also the fault must be observed, making test pattern generation difficult. More recently, pseudo random patterns have been employed with the feature of easy generation. These types of tests can be built into the integrated circuit thus reducing the need for expensive automatic test equipment separate from the circuit. These tests however still miss many defects as they use logic level tests usually based on rather simple fault models.

For example parametric faults such as delay faults and abnormal quiescent current levels are not completely covered by logic fault models. As such, off chip monitoring of the current conducted by the chip improves test coverage. A difficulty however arises due to resolution, that is, if only one transistor on a chip with several tens of thousands is malfunctioning, the defective current has to be resolved from the normal leakage current. In general this process may take an unreasonable amount of time if it is resolvable at all.

It has therefore been a well known requirement for a significant period of time to provide built-in current monitoring directly on the chip since this allows for improved resolution and tailoring of the monitor to various circuit applications such as partitioning I/O and logic blocks with different power requirements or numbers of devices.

Off chip monitoring techniques have therefore been well developed and are widely known and used in practice. The requirement for built-in monitoring is also well known but has up till now found little or no actual implementation.

One example of an arrangement of this type using a built-in testing procedure is shown in U.S. Pat. No. 5,025,344 (Maly et al) issued Jun. 18, 1991. This patent provides a built-in fault detection circuit associated with the main circuit or a part of the main circuit on the substrate and arranged to measure the main circuit current ($I_{dd}$). It is well known that the circuit current includes a low quiescent value ($I_{ddq}$) while the circuit is not switching which is then significantly increased to a transient value when the circuit is switching in response to stimulation. It is further known that an abnormally high quiescent current is indicative of a fault or faults in the main circuit of a type which may not be detectable using the above mentioned logic level testing. The above patent therefore provides an arrangement which triggers the detection of the circuit current at a time after the transient is expected to have decayed so as to determine whether the quiescent circuit current lies below a predetermined reference current.

The above patent uses a technique which acts to detect abnormally high circuit current from a direct voltage measurement across a non-linear device (BJT transistor). The voltage developed across the BJT transistor is compared to a reference voltage. The voltage is detected between a virtual ground of the main circuit and a global ground of the substrate.

There are several disadvantages of this technique. Firstly, low voltage measurements are susceptible to noise problems and therefore it may be difficult to provide an accurate determination of the value of the current relative to the reference. Secondly, the detection of the voltage between the virtual ground and the global ground requires that the original main CMOS circuit is no longer directly tied to the global ground. The original main CMOS circuit is instead connected only to the virtual ground, which virtual ground is referenced from the global ground by the voltage across the BJT transistor. This technique may therefore have a detrimental effect on the operation of the main circuit, particularly where the output of the main circuit is expected to be transmitted to other portions of the complete integrated circuit.

SUMMARY OF THE INVENTION

The object of the invention is to provide improved resolution for on-chip current monitoring using current-mode circuit techniques.

to provide improved fault coverage for non-traditional faults such as bridging, breaks, transistor stuck on, and additional parametric faults.

to provide improved measurement accuracy using matched components allowing for tracking of process variations as well as temperature variations across the chip.

to provide a circuit which can be implemented in standard fabrication technology with limited impact on the manufacturing process.

to provide a circuit with minimal performance degradation to the actual circuit.

to provide a circuit with at-speed, or near operational at-speed, test capability.

to provide a circuit with the potential for concurrent checking of the main circuit under normal operation conditions.

to provide a circuit with the potential for in field, off-line test and diagnosis capability.

to provide control signals that can be combined with higher level control circuitry to allow individual malfunctioning units to be shut down in a low current state in a redundant system.

The objectives of the invention are achieved with a current mode built-in quiescent current monitor. High resolution and increased noise immunity are achieved using a control loop to generate a current in proportion to the circuit under test current. This current is then compared to a reference current, thereby indicating acceptable or abnormally high quiescent current. Accuracy is improved through the use of matched devices. An advantage of this method is that any voltage drop is from the positive supply thereby retaining noise margin near GND. Another advantage is that the circuit will match the speed of the circuit under test as well as reflect local temperature variations on device characteristics.

One or more embodiments of the invention will now be described in conjunction with the accompanying drawings.

BRIEF DESCRIPTION OF THE DRAWINGS

In the drawings, like characters of reference indicate corresponding parts in the different figures.

DETAILED DESCRIPTION

Figure 1:
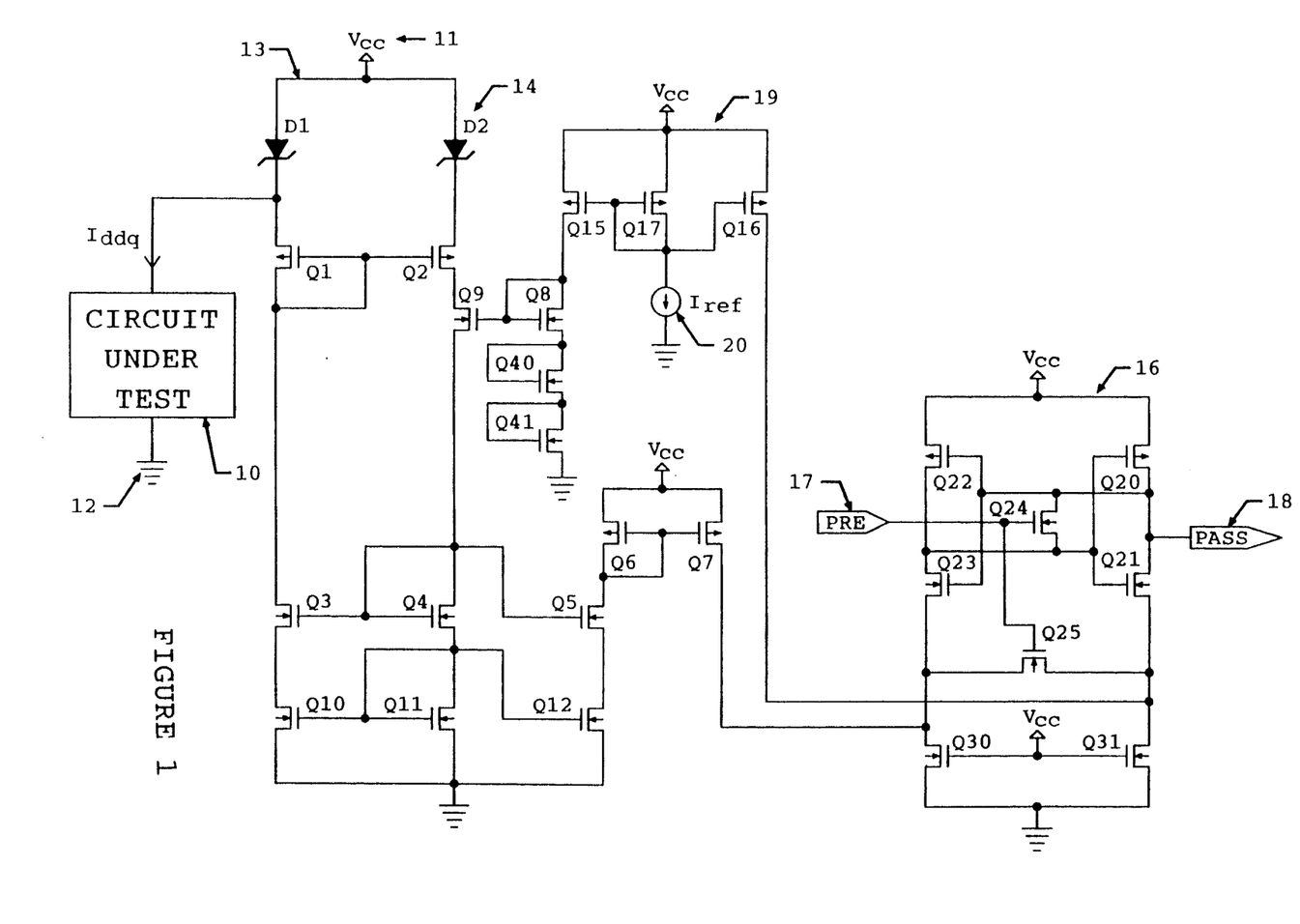
FIG. 1 is a schematic of the full detection circuit according to the present invention.

Turning firstly to FIG. 1, the full detail of one example of the fault testing circuit is illustrated in the schematic as shown.

Figure 5:
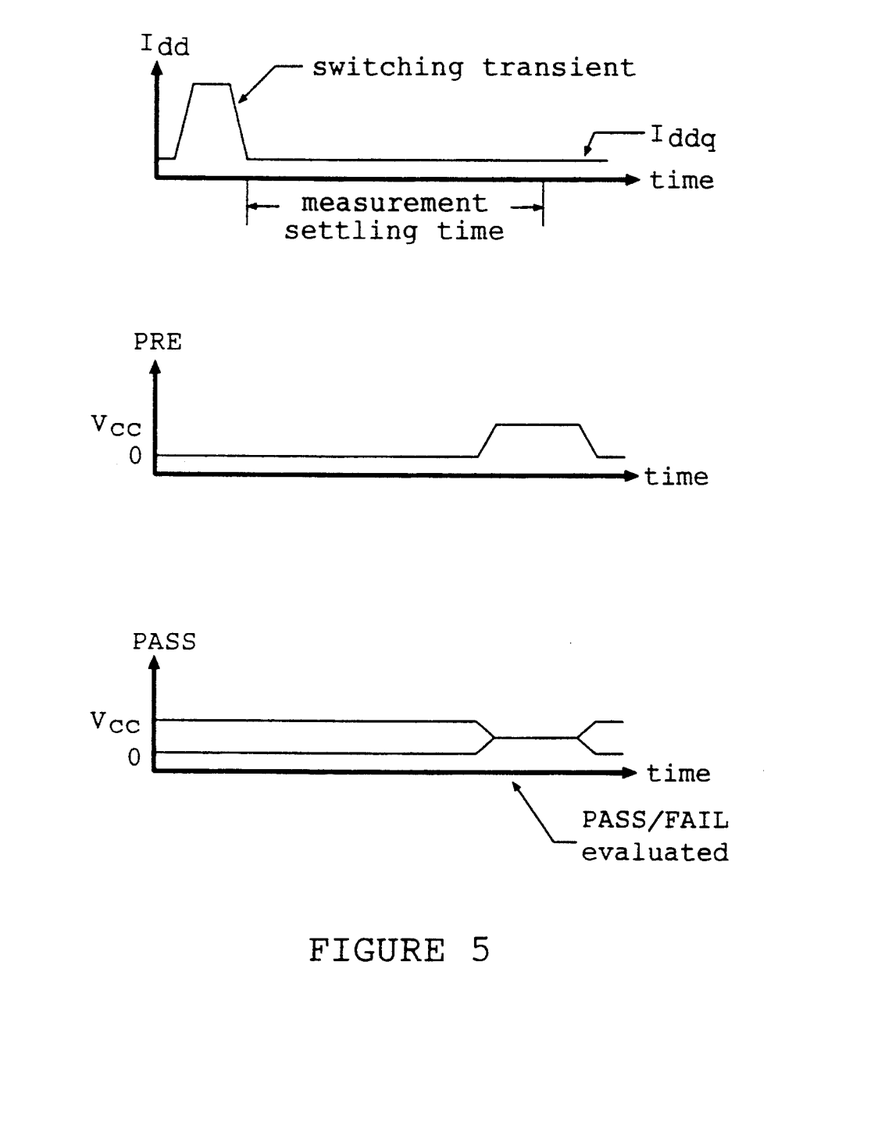
FIG. 5 is a graphic illustration of the operation of the circuit of FIG. 1 showing the high level transient in the main circuit, the timing signal for operation of the fault detection circuit and the output from the fault detection circuit.
Figure 6:
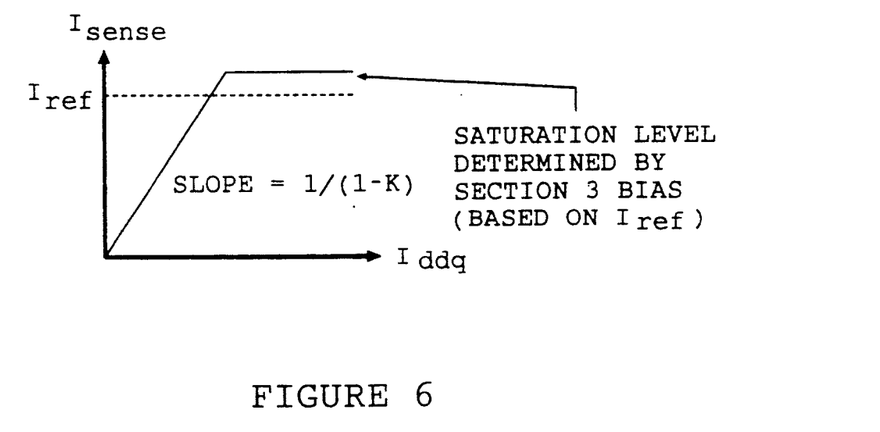
FIG. 6 is a graphic illustration of the value of the testing current generated by the control loop relative to the circuit current.

In general terms the circuit as shown in FIG. 1 including the main circuit assembly or circuit under test indicated at 10 is provided on a substrate as an integrated semi-conducting circuit. The circuit under test may comprise the whole circuit on the substrate or may simply comprise one element of the whole circuit. The main circuit 10 is connected so that a voltage is provided to the main circuit from a first conductor Vcc generally indicated at 11 so that current flows from the first conductor 11 through the circuit under test to a ground 12, the current being indicated at Iddg. As previously explained and as shown in FIG. 5, the circuit current passing through the circuit under test indicated at $I_{dd}$ varies from a low level indicated at $I_{dd}$ to a high transient value indicated as a "switching transient". The current passes through a first path 13 of the control loop which includes a diode D1. This control loop generally indicated at 14 includes a second path 15 within which, as explained hereinafter, is generated a test current which is directly proportional to and significantly less than the circuit current in the path 13.

Figure 3:
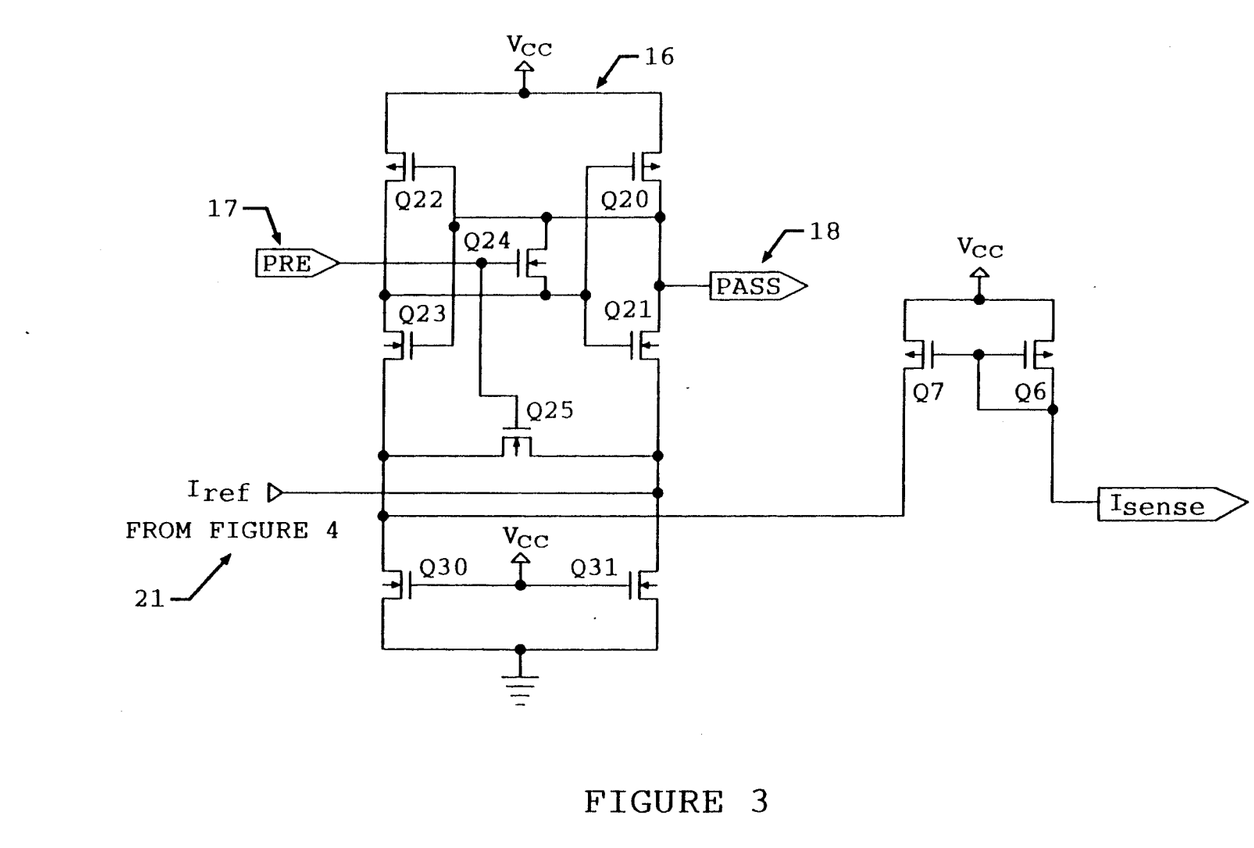
FIG. 3 is a schematic of a second portion of the circuit of FIG. 1 showing the comparator.

The circuit further includes a comparator section generally indicated at 16 and shown in more detail in FIG. 3. The comparator includes a connector 17 for receiving a timing signal indicated at PRE. The circuit is also arranged to generate an output indicated at 18 which constitutes a signal PASS indicative of the presence or absence of a fault in the circuit under test generated by a comparison of the test current with a reference current.

The timing signal PRE can be generated in a number of different ways for injection into the comparator to trigger the comparator at a time when the transient has decayed as shown in FIG. 5. In one example the timing signal PRE can be generated from the clock pulse of the main circuit since the operation of the comparator will generally be sufficiently rapid to enable the comparison to be completed before the clock pulse triggers operation of the main circuit thus creating the transient.

As stated above the circuit as shown in FIG. 1 may comprise only one of a plurality of such circuit elements provided on the total integrated circuit for testing various circuit elements of the integrated circuit. It is necessary therefore for the PASS signals to be detected and checked to determine the presence or absence of faults in all of the separate elements of the circuit. Various different techniques for checking the PASS signals can be provided including a conventional scan chain arrangement or simply an AND gate arrangement which provides a global pass or fail signal in the event that any one of the elements of this circuit should fail.

Figure 4:
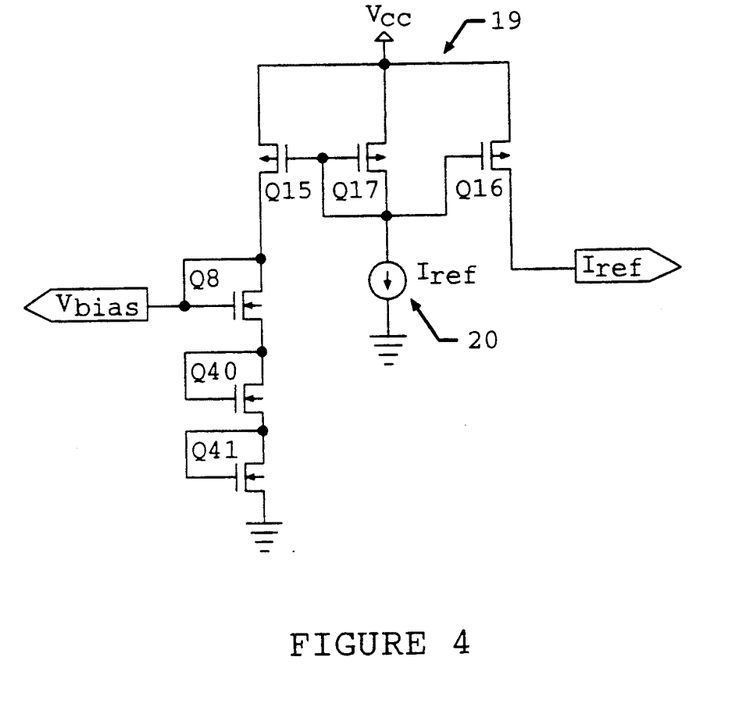
FIG. 4 is a schematic of a further portion of the circuit of FIG. 1 showing the generation of the reference current and a current limiting device controlling the maximum current flow in the control loop.

The circuit further includes the reference current and current limiter section generally indicated at 19 and shown in more detail in FIG. 4. This circuit element includes a reference current generator generally indicated at 20. Various different techniques for the generation of a reference current can be employed. In one example the current may be generated simply by a biased transistor circuit which mimics the type of fault to be detected and thus generates a current which is indicative of the fault to be detected so that a comparison which indicates that the Iddq is less than this fault current will be indicative of a non-faulty circuit. In addition the reference current generator 20 can include means for reducing the reference current to zero and in some cases for adjustment of the reference current to different values for testing of different fault types.

In general terms, therefore, the present circuit operates to generate a test current in the second path 15 of the control loop which is directly proportional to but less than the circuit current and then to compare that test current with the reference current generated by the reference current generator 20. The comparison takes place at an instant as determined by the input timing signal PRE to indicate an instantaneous signal at PASS which is indicative of whether the test current is less than or greater than the reference current to provide an indication of the presence of a fault. The testing circuit operates at the connection between the main circuit and the supply voltage and uses analogue current mode techniques to carry out the necessary analysis.

Figure 2:
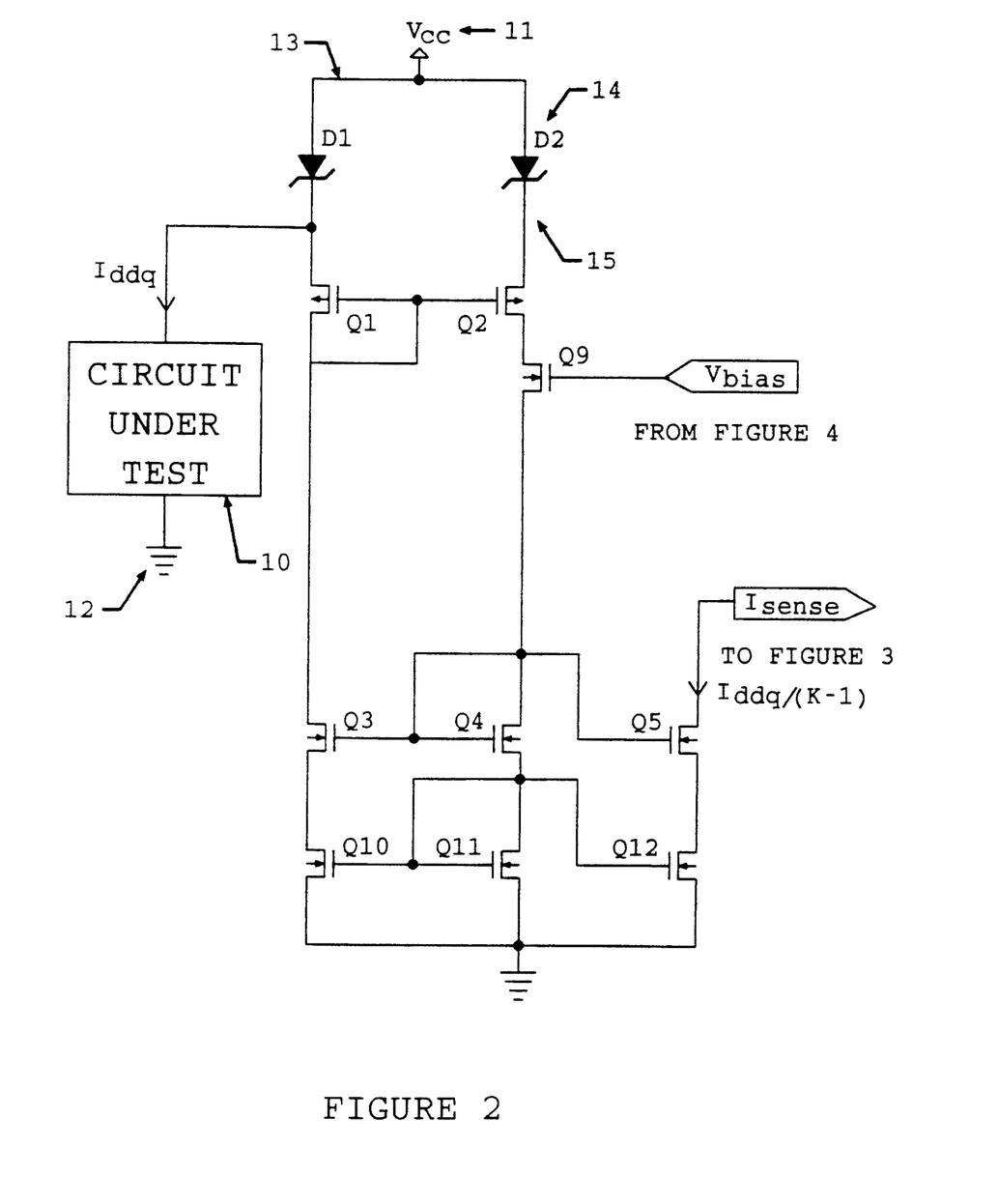
FIG. 2 is a schematic showing a first major component of the circuit of FIG. 1, that is the control loop for generation of the test current proportional to the circuit current.

Turning therefore to FIG. 2, the first main part of the circuit of FIG. 1 is shown which comprises the control loop including the first and second paths for generating the test current which is proportional to the circuit current. The control loop is composed of the diode D1 and D2 together with transistors Q1, Q2, Q3, Q4, Q10 and Q11.

Diode D2 is proportionally matched to Diode D1. The transistor groups $(Q_1,Q_2)$ and $(Q_3,Q_4,Q_5)$ and $(Q_{10},Q_{11},Q_{12})$ are also required to be proportionally matched.

The term "matched" means that devices are fabricated with the same dimensions, this will make the device characteristics the same or matched. Furthermore to prevent processing variations such as doping concentrations from effecting the device characteristics, the above matched components are fabricated in close proximity to each other.

Matched components provide accuracy because device characteristics for two matched components will have the same behavior when a parameter, such as temperature, varies. The close proximity will maintain the same temperature across the matched devices. In a similar manner the devices will have the same doping concentrations and as such will maintain the same device characteristics (i.e. same I-V characteristics).

The control loop serves three purposes.

1. It forces the voltage across Diode D2 to match the voltage across the Diode D1 by draining current through Diode D2;
2. It forces the current through Diode D2 required to serve function 1 above to flow through transistor Q2 thus adding to the current through Diode D1;
3. It allows the current flowing through Diode D2 to be monitored through a high impedance port at the drain of transistor Q5.

Transistors Q3, Q10 and Q11 form a cascoded current mirror which is a device well known in analogue current mode techniques. This is achieved by the arrangement as shown in which the drain of transistor Q4 is connected to the gates of transistors Q3 and Q4. The symmetrical arrangement involving the transistors Q10, Q11 and Q12 provides a significant increase in impedence which reduces noise in the current magnitudes.

The use of the current mirror arrangement causes the current flowing through Q1 to be mirrored to flow through the transistor Q2.

For the present analysis, the operation of transistor Q9 is omitted and it is assumed that Q9 is replaced by a short from source to drain. The explanation of the operation of the transistor Q9 will be presented hereinafter.

Given that the currents through transistors Q1 and Q2 are equal and that these are matched transistors, the gate to source voltage of transistors Q1 and Q2 wi 11 also be equal. This results in equal voltages across diodes D1 and D2. Since, as explained above, the diode D2 is proportionally matched to Diode D1 (that is the impedance of diode D1 is a multiple (k) of the impedance of diode D2) then, given that the voltage across diode D1 is equal to the voltage across diode D2, the current through diode D1 is equal to that multiple times the current through diode D2 ($I_{D1} = K\ I_{D2}$).

As $I_{D1} = I_{D2} + Iddq$ where Iddg is the current delivered to the circuit under test, then $I_{D2} = Iddq/(K-1)$.

A third port on the current mirror defined by transistors Q3, Q4, Q10 and Q11 is formed by Q5, Q12. As a consequence the current through the drain of transistor Q5 is equal to the test current passing through diode D2 which is equal to Iddg/(K−1). Thus the test current is mirrored at the drain of transistor Q5 and is directly proportional to the current through the circuit under test.

Turning now to FIG. 3, the construction is shown in more detail. The comparator 16 comprises transistors Q6, Q7, Q20, Q21, Q22, Q23, Q24, Q25, Q30 and Q31. The comparator acts as a strobed comparator operated by the timing signal PRE. The comparator comprises a current mode sense amplifier of the type disclosed in a paper published in IEEE Journal of Solid State Circuits Volume 26 No. 4 April 1991 by Blalock and Jaeger.

Transistors Q6 and Q7 form a current mirror to mirror the current from the control section discussed above to make it compatible for the input of the comparator. The other input of the comparator indicated at 21 comes from the current reference circuit of FIG. 4 discussed hereinafter.

Considering an initial condition of the circuit in which PRE is held at VCC as shown in FIG. 5, this enables transistors Q24 and Q25 to be on. Transistor Q24 being on forces the normally complimentary output voltages of the current mode sense amplifier formed by transistors Q20, Q21, Q22 and Q23 to be forced to the same potential near the midway voltage point between Vcc and ground.

Transistor Q25 being on maintains an equal potential on the inputs to the comparator from both the reference current supply and the test current. Transistor Q25 has the effect of equalizing the currents through transistors Q30 and Q31.

The comparator is actuated by the signal PRE being forced low at which time the transistors Q24 and Q25 are turned off. This places the circuit in a high gain, unstable state. Transistor Q25 being off allows the voltages at the drains of transistors Q30 and Q31 to differ as a result of difference in the input currents. This voltage difference implies a difference in the gate to source voltages of transistors Q23 and Q21, with the gate voltages of transistors Q23 and Q21 having been previously established by transistor Q24 to be equipotential. When the test current is less than the reference current, a lower voltage at the drain of transistor Q30 than at the drain of transistor Q31 leading to the gate to source voltage of transistor Q23 exceeding that of transistor Q21 will result. This results in a reduced drain voltage of transistor Q23 versus that of transistor Q21. These voltages then result in the circuit attaining a stable state of PASS equal to Vcc. This signal therefore indicates that the quiescent current was below the threshold and therefore acceptable.

In the event that the test current is greater than the reference current, the circuit attains a stable state of PASS equal to ground. The PASS signal can therefore be detected to determine the level of the test current and thus whether the circuit current remains below a fault condition.

In the circuit of FIG. 3 it is necessary that the following pairs of transistors are matched: (Q6,Q7), (Q20,Q22), (Q21,Q23), (Q30,Q31).

Turning now to FIG. 4, this includes the transistors Q9, Q8, Q40, Q41, Q15, Q17 and Q16 together with the reference current generator 20. The function of transistor Q9 is to limit the current in the second path 15. This is important because it limits the control circuit saturation current which results from large currents through diode D1 during switching transients in the circuit under test. This also has the additional effect of decreasing settling time of the control loop to acceptable values of the quiescent current as soon as possible after the switching transients. The saturation value of the control loop current is determined by transistors QS, Q40, Q41, Q15, Q17 and Iref. If the current in the control exceeds the current in the drain of transistor Q15 which is set to be of a value slightly greater than Iref, then transistor Q9 will go into saturation, limiting the current in a control loop or second path.

Note that the transistors Q8, Q9 form a matched pair and that transistor Q40 is matched to transistors Q3, Q4 and Q5 and that transistor Q41 is matched to transistors Q10, Q11 and Q12. Transistor Q16 forms a current mirror with transistor Q17 and delivers a current equal to Iref to the comparator discussed above. Iref should be based either on the maximum allowable leakage or the minimum amount of current that a fault would generate. This can be accomplished by simply biased transistor circuit mimicing the lowest current fault in the fault set. Transistors Q15, Q16 and Q17 can be scaled in order to scale the reference current as desired.

Shut down of the test circuit can be achieved simply by actuating the reference current generator 20 so as to reduce Iref to zero. With Iref equal to zero then the current in all major components of the test circuit will drop to leakage values.

In a redundant system, for example, in a system with multiple functional units, a higher level control function can be initially established. When a functional unit in question is faulty, that there is excessive current drain, the higher level control sequences through test vectors to the functional unit in question until a vector resulting in an acceptable quiescent current level is found. The faulty functional unit is then left with this vector applied, in order to maintain low power dissipation. This unit is then flagged as not operational.

Since various modifications can be made in our invention as hereinabove described, and many apparently widely different embodiments of the invention made within the spirit and scope of the claims without departing from such spirit and scope, it is intended that all matter contained in the accompanying specification shall be interpreted as illustrative only and not in a limiting sense.

We claim:

1. A semiconductor integrated circuit comprising a substrate, a main circuit assembly provided on the substrate, first conductor means for providing a circuit voltage to the main circuit assembly, second conductor means providing a ground connection for said main circuit assembly arranged such that circuit current flows from said first conductor means to said second conductor means through said main circuit assembly, the magnitude of the circuit current varying from a quiescent circuit current when the main circuit assembly is not switching to a higher transient value when the main circuit assembly is switching, and a fault testing circuit assembly provided on the substrate arranged for detection of faults in the main circuit assembly, said fault testing circuit assembly including test means for generating a test current having a magnitude directly proportional to and less than that of said circuit current, means for receiving a timing signal, generator means for generating a reference current having a magnitude related to that of an expected quiescent circuit current, and comparator means responsive to said timing signal for comparing instantaneous magnitudes of said test current and said reference current and for generating a first signal when the test current has a magnitude less than that of the reference current and a second different signal when the test current has a magnitude greater than that of the reference current.

2. The circuit according to claim 1 wherein said test means includes a current mirror circuit.

3. The circuit according to claim 1 wherein the test means includes a cascoded current mirror circuit.

4. The circuit according to claim 1 wherein the test means includes a first circuit path arranged such that said circuit current passes therethrough, a second circuit path parallel to the first circuit path, said first and second circuit paths having components therein causing said test current to flow in said second circuit path with said components arranged such that the test current is smaller than and proportional to the circuit current, said components of said first circuit path being matched with said components of said second circuit path.

5. The circuit according to claim 4 wherein said components of said first and second circuit paths define a current mirror circuit arranged to cause a current equal to said test current to be transmitted from between test means and said comparator means.

6. The circuit according to claim 4 wherein said second circuit path includes restriction means therein for restricting the test current from rising above a predetermined maximum magnitude.

7. The circuit according to claim 6 wherein the test means includes means for generating a current slightly greater than said reference current and wherein said restriction means is responsive to said slightly greater current.

8. The circuit according to claim 7 wherein said restriction means comprises a transistor which is saturated in response to said slightly greater current.

9. The circuit according to claim 1 wherein said test means includes means for restricting the test current from rising above a predetermined maximum magnitude.

10. The circuit according to claim 1 including means for controlling said generator means so as to reduce said reference current to a magnitude of zero whereby to shut down said main circuit assembly.

11. The circuit according to claim 1 wherein said comparator means is arranged to generate as said first signal a voltage equal to the circuit voltage and to generate as said second signal a voltage equal to that of the ground connection.

12. The circuit according to claim 1 wherein said test means is connected between said first conductor means and said fault testing circuit assembly.

13. A semiconductor integrated circuit comprising a substrate, a main circuit assembly provided on the substrate, first conductor means for providing a circuit voltage to the main circuit assembly, second conductor means providing a ground connection for said main circuit assembly arranged such that circuit current flows from said first conductor means to said second conductor means through said main circuit assembly, the magnitude of the circuit current varying from a quiescent circuit current when the main circuit assembly is not switching to a higher transient value when the main circuit assembly is switching, and a fault testing circuit assembly provided on the substrate arranged for detection of faults in the main circuit assembly, said fault testing circuit assembly including test means for generating a test current having a magnitude proportional to that of said circuit current, and means for analyzing said test current, the test means including a first circuit path arranged such that said circuit current passes therethrough, a second circuit path parallel to the first circuit path, said first and second circuit paths having components therein causing said test current to flow in said second circuit path with said components arranged such that the test current is smaller than and directly proportional to the circuit current, said components of said first circuit path being matched with said components of said second circuit path, said components of said first and second circuit paths defining a current mirror circuit arranged to cause a current equal to said test current to be transmitted between said test means and said analyzing means.

14. The circuit according to claim 13 wherein said second circuit path includes means therein for restricting the test current from rising above a predetermined maximum magnitude.

15. The circuit according to claim 13 wherein said test means is connected between said first conductor means and said main circuit assembly.

* * * * *